(12) United States Patent
Lee et al.

(10) Patent No.: US 11,315,735 B2
(45) Date of Patent: Apr. 26, 2022

(54) MULTILAYERED CAPACITOR AND BOARD INCLUDING THE SAME MOUNTED THEREON

(71) Applicant: SAMSUNG ELECTRO-MECHANICS CO., LTD., Suwon-si (KR)

(72) Inventors: Sang Jong Lee, Suwon-si (KR); Su Bong Jang, Suwon-si (KR); Hee Soo Yoon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 42 days.

(21) Appl. No.: 16/849,588

(22) Filed: Apr. 15, 2020

(65) Prior Publication Data
US 2021/0183577 A1    Jun. 17, 2021

(30) Foreign Application Priority Data

Dec. 13, 2019 (KR) .......................... 10-2019-0167022

(51) Int. Cl.
| | |
|---|---|
| *H01G 4/30* | (2006.01) |
| *H01G 2/06* | (2006.01) |
| *H01G 4/12* | (2006.01) |
| *H01G 4/012* | (2006.01) |

(52) U.S. Cl.
CPC ............... *H01G 4/30* (2013.01); *H01G 2/065* (2013.01); *H01G 4/012* (2013.01); *H01G 4/1218* (2013.01)

(58) Field of Classification Search
CPC ............ H01G 4/12; H01G 2/065; H01G 2/24; H01G 4/0085; H01G 4/012; H01G 4/20; H01G 4/2325; H01G 4/30; H01G 4/306; H01G 4/33; H01G 4/065; H01G 4/1218
See application file for complete search history.

(56) References Cited

U.S. PATENT DOCUMENTS

| | | | | |
|---|---|---|---|---|
| 2010/0039749 | A1* | 2/2010 | Ritter ..................... | H01G 4/005 361/301.4 |
| 2015/0014035 | A1* | 1/2015 | Park ....................... | H01G 4/012 174/260 |
| 2016/0196921 | A1* | 7/2016 | Oh .......................... | H01G 4/30 174/260 |
| 2019/0080843 | A1* | 3/2019 | Jang ....................... | H01G 4/232 |
| 2019/0385793 | A1* | 12/2019 | Wakashima ............. | H01G 4/30 |

FOREIGN PATENT DOCUMENTS

| | | |
|---|---|---|
| JP | H10-289837 A | 10/1998 |
| KR | 10-2009-0117686 A | 11/2009 |

* cited by examiner

*Primary Examiner* — Michael P McFadden
(74) *Attorney, Agent, or Firm* — Morgan, Lewis & Bockius LLP

(57) ABSTRACT

Provided is a multilayer capacitor and a board on which the multilayer capacitor is mounted. The multilayer capacitor includes a capacitor body including first to six surfaces, first and second dielectric layers, and first and second internal electrodes; first and second external electrodes disposed on the first surface of the capacitor body; the first and second dielectric layers are alternately layered in a first direction such that the first internal electrode of the first dielectric layer overlaps the second internal electrode of the second dielectric layer in the first direction, and the second internal electrode of the first dielectric layer overlaps the first internal electrode of the second dielectric layer in the first direction.

11 Claims, 8 Drawing Sheets

MULTILAYERED CAPACITOR AND BOARD INCLUDING THE SAME MOUNTED THEREON

CROSS-REFERENCE TO RELATED APPLICATION(S)

This application claims benefit of priority to Korean Patent Application No. 10-2019-0167022 filed on Dec. 13, 2019 in the Korean Intellectual Property Office, the disclosure of which is incorporated herein by reference in its entirety.

TECHNICAL FIELD

The present disclosure relates to a multilayer capacitor and a board including the same mounted thereon.

BACKGROUND

As a thickness of a smartphone has been reduced, an electronic component has been designed to have a reduced weight and thickness and improved integration density, and a greater number of passive than active elements have been applied to an electronic device.

There has been increased interest in a multilayer capacitor among such passive elements. That is because a greater number of multilayer capacitors may be mounted on a circuit than other types of passive elements, and with the development of microelectronics technology, a decoupling capacitor having increased capacitance and a reduced connection length has been required. Accordingly, the importance of a multilayer capacitor in an electrical circuit has increased.

Also, such a multilayer capacitor has been required to have low equivalent series resistance (ESR) to implement high efficiency with the same capacitance and to have low equivalent serial inductance (ESL) to significantly reduce a ripple of a power current.

SUMMARY

An aspect of the present disclosure is to provide a multilayer capacitor having high capacitance, reduced ESR and ESL.

According to an aspect of the present disclosure, a multilayer capacitor includes including a capacitor body including first and second surfaces opposing each other, third and fourth surfaces connected to the first and second surfaces and opposing each other, fifth and sixth surfaces connected to the first and second surfaces and to the third and fourth surfaces and opposing each other, and including first and second dielectric layers, a plurality of first internal electrodes and a plurality of second internal electrodes alternately layered in a first direction in which the fifth and sixth surfaces oppose each other; a first external electrode disposed on the first surface of the capacitor body and connected to the plurality of first internal electrodes; a second external electrode disposed on the first surface of the capacitor body, spaced apart from the first external electrode, and connected to the plurality of second internal electrodes. Portions of first and second internal electrodes are disposed on a first dielectric layer and are spaced apart from each other. Other portions of first and second internal electrodes are disposed on a second dielectric layer and are spaced apart from each other, and the first and second dielectric layers are alternately layered in the first direction such that the first internal electrode of the first dielectric layer overlaps the second internal electrode of the second dielectric layer in the first direction, and the second internal electrode of the first dielectric layer overlaps the first internal electrode of the second dielectric layer in the first direction.

The first internal electrode may include a 1-1st internal electrode disposed on the first dielectric layer; a 1-2nd internal electrode disposed on the second dielectric layer and configured to not overlap the 1-1st internal electrode in the first direction; a 1-1st connection portion connected to the 1-1st internal electrode and having an end exposed through the first surface of the capacitor body and connected to the first external electrode; and a 1-2nd connection portion connected to the 1-2nd internal electrode and having an end exposed through the first surface of the capacitor body and connected to the first external electrode, and the second internal electrode may include a 2-1st internal electrode disposed on the first dielectric layer and configured to overlap the 1-2nd internal electrode in the first direction; a 2-2nd internal electrode disposed on the second dielectric layer and configured to overlap the 1-1st internal electrode in the first direction; a 2-1st connection portion connected to the 2-1st internal electrode and having an end exposed through the first surface of the capacitor body and connected to the second external electrode; and a 2-2nd connection portion connected to the 2-2nd internal electrode and having an end exposed through the first surface of the capacitor body and connected to the second external electrode.

The 1-1st internal electrode may be symmetrical to the 2-2nd internal electrode in a third direction in which the third and fourth surfaces are connected to each other, and the 1-2nd internal electrode may be symmetrical to the 2-1st internal electrode in the third direction.

The first and second internal electrodes may be spaced apart from the second, third, and fourth surfaces of the capacitor body in the capacitor body.

Each of a combined structure of the 1-2nd internal electrode and the 1-2nd connection portion and a combined structure of the 2-1st internal electrode and the 2-1st connection portion may have a "ㄱ"-shaped form.

The first internal electrode may include a 1-1st internal electrode disposed on the first dielectric layer; two 1-2nd internal electrodes disposed on the second dielectric layer and configured to not overlap the 1-1st internal electrode in the first direction; a 1-1st connection portion connected to the 1-1st internal electrode and having an end exposed through the first surface of the capacitor body and connected to the first external electrode; and a 1-2nd connection portion connected to the 1-2nd internal electrode and having an end exposed through the first surface of the capacitor body and connected to the first external electrode, and the second internal electrode may include a plurality of 2-1st internal electrodes disposed on the first dielectric layer and configured to overlap the plurality of 1-2nd internal electrodes in the first direction, respectively; a 2-2nd internal electrode disposed on the second dielectric layer and configured to overlap the 1-1st internal electrode in the first direction; a 2-1st connection portion connected to the plurality of 2-1st internal electrodes and having an end exposed through the first surface of the capacitor body and connected to the second external electrode; and a 2-2nd connection portion connected to the 2-2nd internal electrode and having an end exposed through the first surface of the capacitor body and connected to the second external electrode.

The first and second internal electrodes may be spaced apart from the second, third, and fourth surfaces of the capacitor body in the capacitor body.

The first internal electrode may include a plurality of 1-1st internal electrodes disposed on the first dielectric layer and spaced apart from each other in a second direction in which the first surface and the second surface oppose each other; a plurality of 1-2nd internal electrodes disposed on the second dielectric layer and configured to not overlap the plurality of 1-1st internal electrodes in the first direction and to be spaced apart from each other in the second direction; a 1-1st connection portion connected to the plurality of 1-1st internal electrodes and having an end exposed through the first surface of the capacitor body and connected to the first external electrode; and a 1-2nd connection portion connected to the plurality of 1-2nd internal electrodes and having an end exposed through the first surface of the capacitor body and connected to the first external electrode, and the second internal electrode may include a plurality of 2-1st internal electrodes disposed on the first dielectric layer and configured to overlap the plurality of 1-2nd internal electrodes in the first direction, respectively, and to be spaced apart from each other in the second direction; a plurality of 2-2nd internal electrodes disposed on the second dielectric layer and configured to overlap the plurality of 1-1st internal electrodes in the first direction, respectively, and to be spaced apart from each other in the second direction; a 2-1st connection portion connected to the plurality of 2-1st internal electrodes and having an end exposed through the first surface of the capacitor body and connected to the second external electrode; and a 2-2nd connection portion connected to the plurality of 2-2nd internal electrodes and having an end exposed through the first surface of the capacitor body and connected to the second external electrode.

The first and second internal electrodes may be spaced apart from the second, third, and fourth surfaces of the capacitor body in the capacitor body.

According to an aspect of the present disclosure, a board on which a multilayer capacitor is mounted includes a board having first and second electrode pads on one surface; and the multilayer capacitor. The first and second external electrodes are mounted on and connected to the first and second electrode pads, respectively.

According to an aspect of the present disclosure, a multilayer capacitor includes a capacitor body including first and second surfaces opposing each other, third and fourth surfaces connected to the first and second surfaces and opposing each other, fifth and sixth surfaces connected to the first and second surfaces and to the third and fourth surfaces and opposing each other, and including first and second dielectric layers alternately layered in a first direction in which the fifth and sixth surfaces oppose each other, the capacitor body further including first and second internal electrodes disposed on each of the first dielectric layers and spaced apart from each other, and third and fourth internal electrodes disposed on each of the second dielectric layers and spaced apart from each other; a first external electrode disposed on the first surface of the capacitor body and connected to each of the first and third internal electrodes; and a second external electrode disposed on the first surface of the capacitor body, spaced apart from the first external electrode, and connected to each of the second and fourth internal electrodes.

Each of the first and second external electrodes may be disposed only on the first surface.

The first internal electrode may overlap the fourth internal electrode in the first direction, and the second internal electrode may overlap the third internal electrode in the first direction.

The first internal electrode may be symmetrical to the fourth internal electrode in a second direction in which the third and fourth surfaces oppose each other, and the third internal electrode may be symmetrical to the second internal electrode in the second direction.

The multilayer capacitor may further include a first connection portion connected to the first internal electrode, and having an end exposed through the first surface of the capacitor body and connected to the first external electrode; a second connection portion connected to the second internal electrode, and having an end exposed through the first surface of the capacitor body and connected to the second external electrode; a third connection portion connected to the third internal electrode, and having an end exposed through the first surface of the capacitor body and connected to the first external electrode; and a fourth connection portion connected to the fourth internal electrode, and having an end exposed through the first surface of the capacitor body and connected to the second external electrode.

Each of the first to fourth internal electrodes and the first to fourth connection portions may be spaced apart from the second, third, and fourth surfaces of the capacitor body.

The multilayer capacitor may further include a fifth internal electrode extending from the second connection portion on the first dielectric layer; and a sixth internal electrode extending from the third connection portion on the second dielectric layer. The fifth internal electrode may overlap the sixth internal electrode in the first direction.

The multilayer capacitor may further include a seventh internal electrode extending from the first connection portion on the first dielectric layer; and an eighth internal electrode extending from the fourth connection portion on the second dielectric layer. The seventh internal electrode may overlap the eighth internal electrode in the first direction.

The first connection portion may overlap the third connection portion in the first direction, and the second connection portion may overlap the fourth connection portion in the first direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
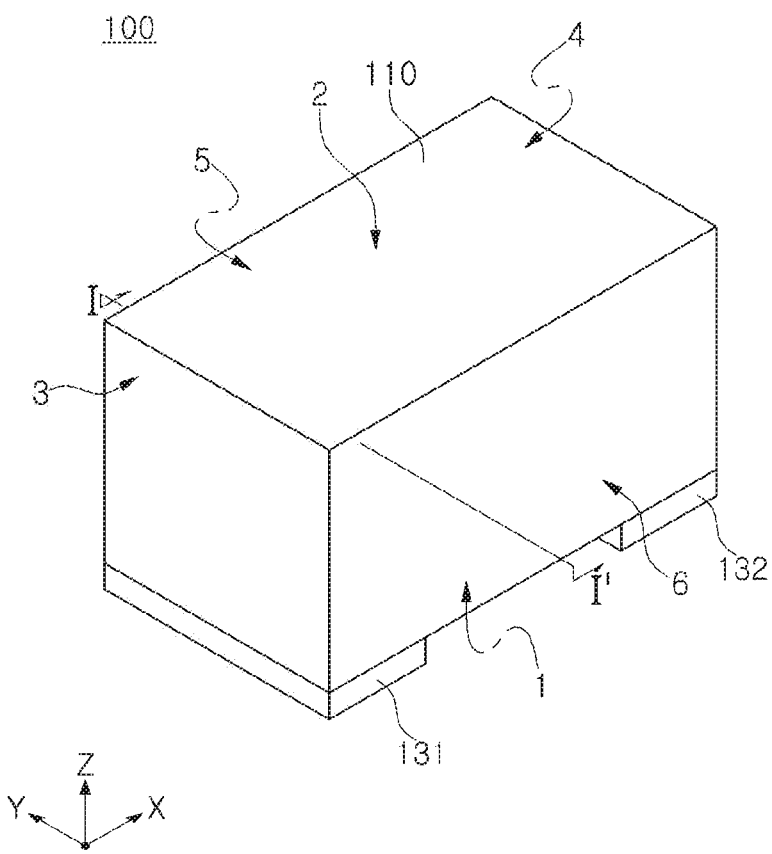
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are the same elements in the drawings.

Further, throughout the specification, it will be understood that when a portion "includes" an element, it can further include another element, not excluding another element, unless otherwise indicated.

In the drawings, an X direction, a Y direction, and a Z direction may indicate a length direction, a width direction, and a thickness direction of a capacitor body 110, respectively.

Figure 2:
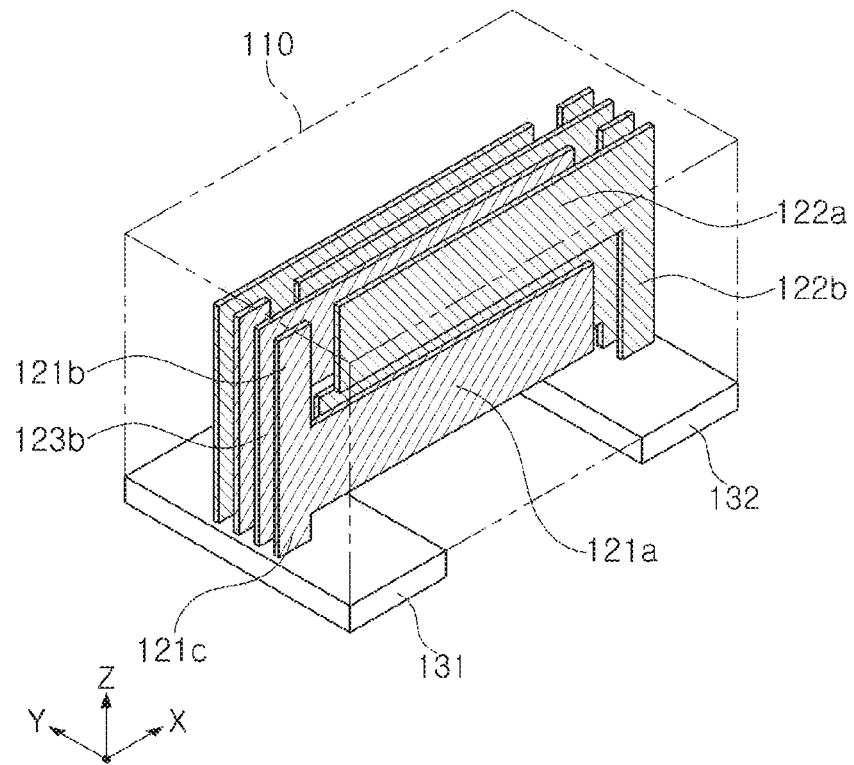
FIG. 2 is a transparent perspective diagram of FIG. 1.
Figure 3A:
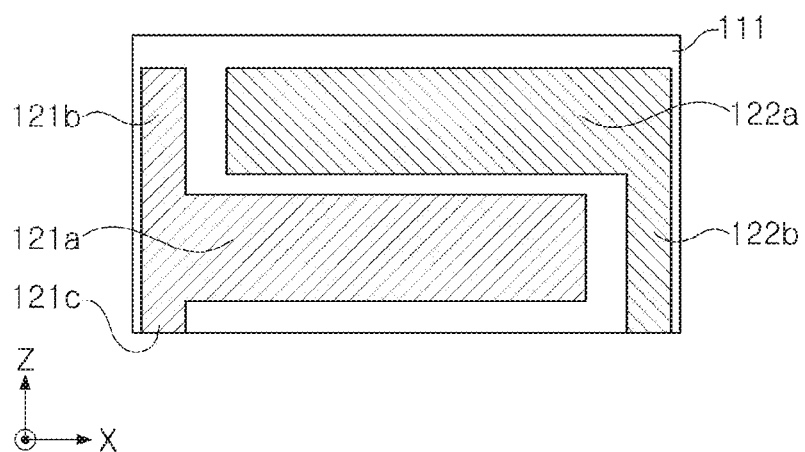
FIGS. 3A and 3B are plan diagrams illustrating first and second dielectric layers and first and second internal electrodes of the multilayer capacitor illustrated in FIG. 1.
Figure 3B:
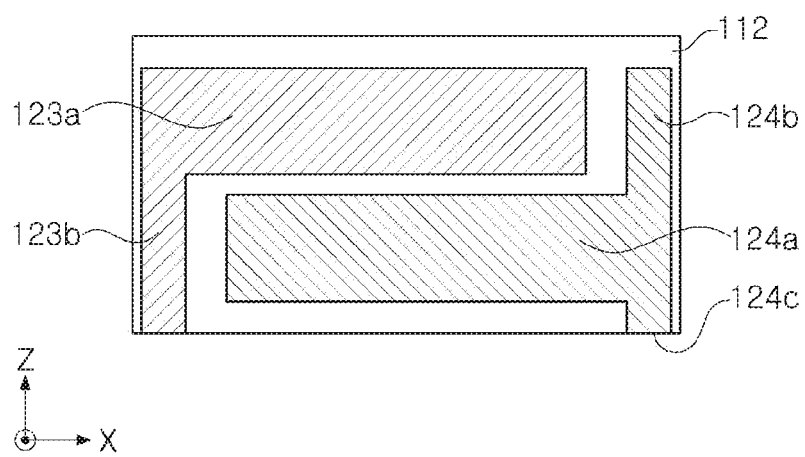
Figure 4:
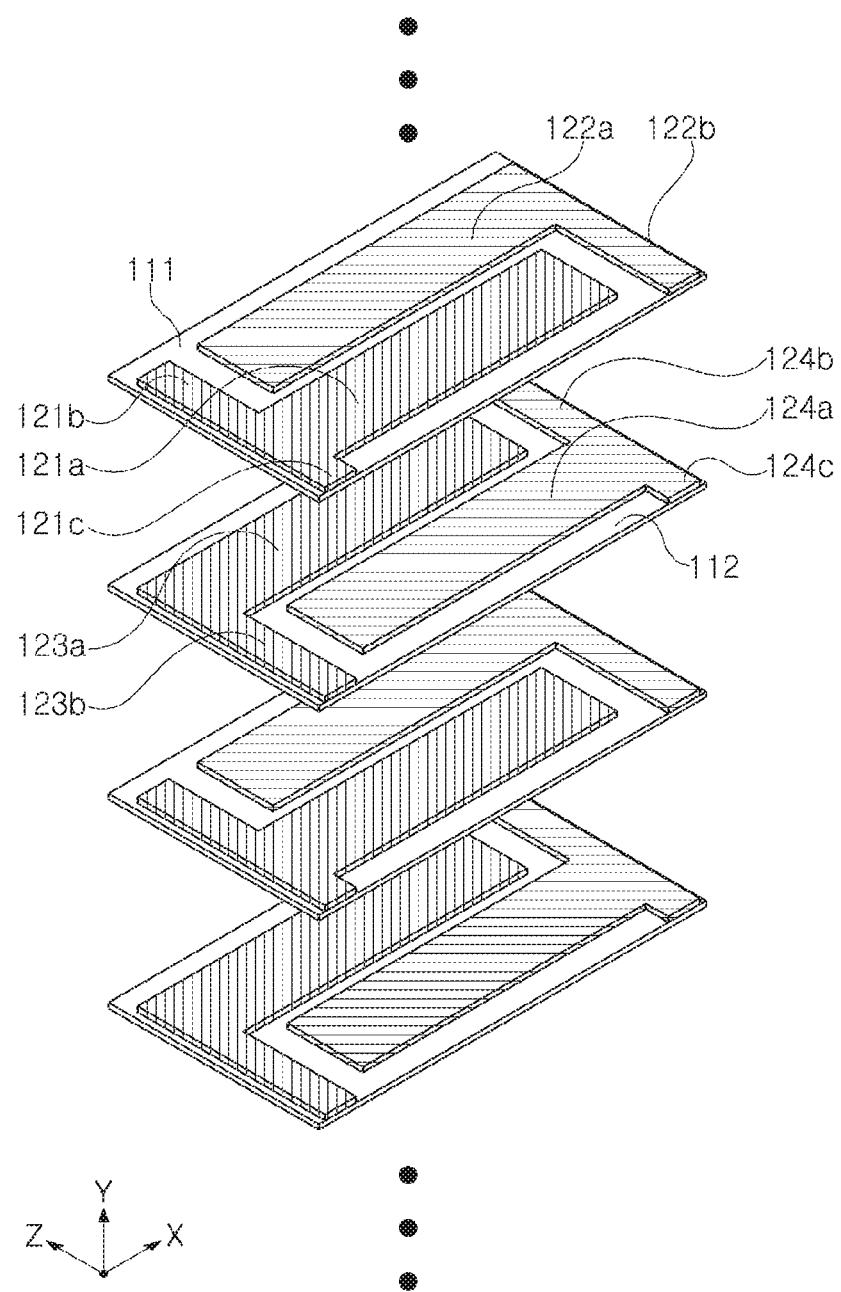
FIG. 4 is a perspective diagram illustrating a laminate structure of first and second dielectric layers of the multilayer capacitor illustrated in FIG. 1.
Figure 5:
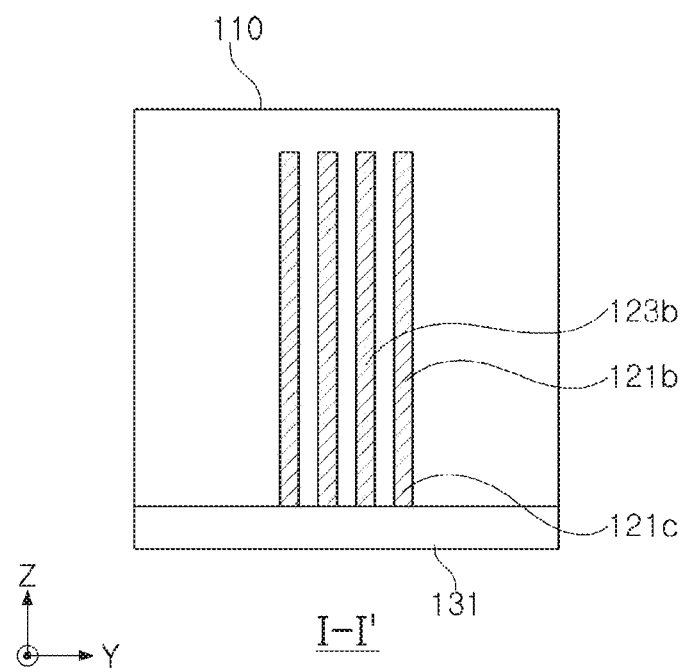
FIG. 5 is a cross-sectional diagram taken along line I-I' in FIG. 1.
Figure 6:
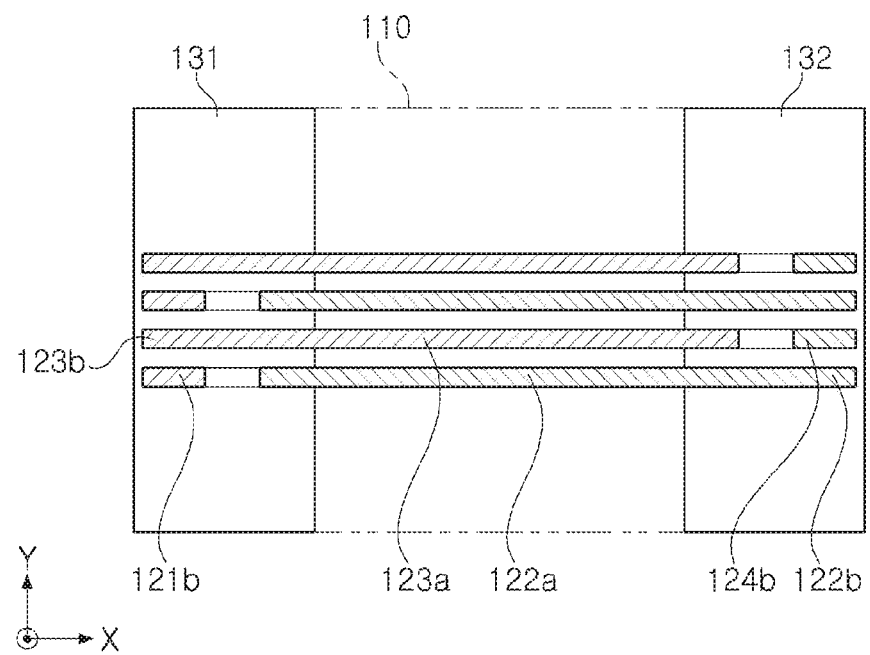
FIG. 6 is a transparent plan diagram of the multilayer capacitor illustrated in FIG. 1.

FIG. 1 is a perspective diagram illustrating a multilayer capacitor according to an example embodiment. FIG. 2 is a transparent perspective diagram of FIG. 1. FIGS. 3A and 3B are plan diagrams illustrating first and second dielectric layers and first and second internal electrodes of the multilayer capacitor illustrated in FIG. 1. FIG. 4 is a perspective diagram illustrating a laminate structure of first and second dielectric layers of the multilayer capacitor illustrated in FIG. 1. FIG. 5 is a cross-sectional diagram taken along line I-I' in FIG. 1. FIG. 6 is a transparent plan diagram of the multilayer capacitor illustrated in FIG. 1.

Referring to FIGS. 1 to 6, a multilayer capacitor 100 in the example embodiment may include a capacitor body 110 and first and second external electrodes 131 and 132.

The capacitor body 110 may be formed by layering a plurality of first and second dielectric layers 111 and 112 in the Z direction and performing a sintering process. A boundary between adjacent first and second dielectric layers 111 and 112 of the capacitor body 110 may be integrated such that it may be difficult to identify the boundary without using a scanning electron microscope (SEM).

The capacitor body 110 may have a hexahedral shape, but an external embodiment thereof is not limited thereto. A shape and a size of the capacitor body 110 and the number of the first and second dielectric layers 111 and 112 may not be limited to the examples illustrated in the diagrams.

In the example embodiment, both surfaces of the capacitor body 110 opposing each other in the Z direction may be defined as first and second surfaces 1 and 2, both surfaces connected to the first and second surfaces 1 and 2 and opposing each other in the X direction may be defined as third and fourth surfaces 3 and 4, and both surfaces connected to the first and second surfaces 1 and 2 and the third and fourth surfaces 3 and 4 and opposing each other in the Y direction may be defined as fifth and sixth surfaces 5 and 6.

The first and second dielectric layers 111 and 112 may include a ceramic material having a high dielectric constant. For example, the first and second dielectric layers 111 and 112 may include barium titanate ($BaTiO_3$) based powder or strontium titanate ($SrTiO_3$) based ceramic powder. However, an example of the material is not limited thereto as along as sufficient capacitance can be obtained therewith.

The first and second dielectric layers 111 and 112 may further include ceramic additives, organic solvents, plasticizers, coupling agents, dispersing agents, and the like, in addition to the ceramic powder.

The ceramic additive may include, for example, a transition metal oxide or a transition metal carbide, a rare earth element, magnesium (Mg) or aluminum (Al), and the like.

The capacitor body 110 may include an active region as a portion contributing to forming capacitance of the capacitor, and cover regions formed on both sides of the active region in the Y direction as margin portions.

The cover regions may have a material and a configuration the same as those of the first and second dielectric layers 111 and 112 other than the configuration in which the cover regions do not include an internal electrode.

The cover regions may be formed by disposing a single dielectric layer or layering two or more dielectric layers on both sides of the active region in the Y direction, and may prevent damage to an internal electrode caused by physical or chemical stress.

The capacitor body 110 may include a plurality of first internal electrodes and a plurality of second internal electrodes.

The first and second internal electrodes may be provided with different polarities, and may be disposed on one surfaces of the first and second dielectric layers 111 and 112 and may be spaced apart from each other.

The first and second internal electrodes may be spaced apart from the second, third, and fourth surfaces 2, 3, and 4 of the capacitor body 110, the first internal electrode may be connected to the first external electrode 131, and the second internal electrode may be connected to the second external electrode 132.

Accordingly, when a certain level of voltage is applied to the first and second external electrodes 131 and 132, an electric charge may be accumulated between the first and second internal electrodes.

Capacitance of the multilayer capacitor 100 may be proportional to an area of overlap between the first and second internal electrodes overlapping in the Y direction in the active region.

A material of the first and second internal electrodes is not limited to any particular material, and may be formed using a conductive paste including one or more materials from among noble materials such as platinum (Pt), palladium (Pd), palladium-silver (Pd—Ag) alloy, and the like, nickel (Ni), and copper (Cu).

As a method of printing the conductive paste, a screen-printing method or a gravure printing method may be used, but an example of the method is not limited thereto.

The first and second external electrodes 131 and 132 may be provided with voltages having different polarities, may be disposed on the first surface 1 of the capacitor body 110 and may be spaced apart from each other in the X direction, and may be electrically connected to the first and second internal electrodes through connection portions exposed through the first surface 1 of the capacitor body 110, respectively.

In the example embodiment, the first and second external electrodes 131 and 132 may only be formed on the first surface 1 of the capacitor body 110.

Accordingly, an overall mounting area of the multilayer capacitor may be relatively reduced as compared to a general structure in which external electrodes are formed on the right and left sides of the capacitor body. Accordingly, mounting density of the board may improve.

The first and second external electrodes 131 and 132 may further include a plating layer configured to cover each of surfaces of the first and second external electrodes 131 and 132.

In the example embodiment, two or more internal electrodes may be disposed on each of the first dielectric layer 111 and the second dielectric layer 112, and the first and second internal electrodes may be spaced apart from each other on the first dielectric layer 111 and also on the second dielectric layer 112.

In other words, the first and second internal electrodes may be spaced apart from each other on a first dielectric layer 111, and the first and second internal electrodes may be spaced apart from each other on a second external electrode 132. In the multilayer capacitor 100, the first and second dielectric layers 111 and 112 may be alternately layered in the Y direction such that the first internal electrode of the first dielectric layer 111 may overlap the second internal electrode of the second dielectric layer 112 in the Y direction, and the second internal electrode of the first dielectric layer 111 may overlap the first internal electrode of the second dielectric layer 112 in the Y direction.

In the example embodiment, the first internal electrode may include a 1-1st internal electrode 121a, a 1-2nd internal electrode 123a, a 1-1st connection portion 121b and a 1-2nd connection portion 123b.

The 1-1st internal electrode 121a may be disposed on the first dielectric layer 111 and may be spaced apart from an edge of the first dielectric layer 111.

The 1-2nd internal electrode 123a may be disposed on the second dielectric layer 112, may be spaced apart from an edge of the second dielectric layer 112, and may be configured to not overlap the 1-1st internal electrode 121a in the Y direction.

The 1-1st connection portion 121b may be a portion extending from an end of the 1-1st internal electrode 121a in the Z direction, and a portion 121c extending downwardly may be exposed to the first surface 1 of the capacitor body 110 and may be connected to the first external electrode 131.

The 1-2nd connection portion 123b may be a portion extending from an end of the 1-2nd internal electrode 123a in the Z direction, and a lower end of the 1-2nd connection portion 123b may be exposed to the first surface 1 of the capacitor body 110 and may be connected to the first external electrode 131.

The 1-1st connection portion 121b and the 1-2nd connection portion 123b may be disposed adjacent to the third surface 3 of the capacitor body 110 to increase an effective area of the internal electrode.

The 1-1st internal electrode 121a may be configured to be adjacent to the downward side of the first dielectric layer 111 in the Z direction, and the 1-2nd internal electrode 123a may be configured to be adjacent to the upward side of the second dielectric layer 112 in the Z direction. Accordingly, when the capacitor body 110 is formed by layering the first and second dielectric layers 111 and 112 in the Y direction, the 1-1st internal electrode 121a and the 1-2nd internal electrode 123a may not overlap each other in the Y direction.

The 1-1st connection portion 121b and the 1-2nd connection portion 123b may be spaced apart from the second, third, and fourth surfaces 2, 3, and 4 of the capacitor body 110.

If desired, the 1-1st connection portion 121b and the 1-2nd connection portion 123b may be configured to be exposed through the third surface 3 of the capacitor body 110, but in this case, the first external electrode may need to be formed on the third surface 3 of the capacitor body 110, or an insulation portion may need to be disposed on the third surface 3 of the capacitor body 110.

Accordingly, a combined structure of the 1-2nd internal electrode 123a and the 1-2nd connection portion 123b may have an "ㄱ"-shaped form, but an example embodiment thereof is not limited thereto.

The second internal electrode may include a 2-1st internal electrode 122a, a 2-2nd internal electrode 124a, a 2-1st connection portion 122b, and a 2-2nd connection portion 124b.

The 2-1st internal electrode 122a may be disposed on the first dielectric layer 111 and may be spaced apart from an edge of the first dielectric layer 111.

The 2-2nd internal electrode 124a may be disposed on the second dielectric layer 112, may be spaced apart from an edge of the second dielectric layer 112, and may be configured to not overlap the 2-1st internal electrode 122a in the Y direction.

The 2-1st connection portion 122b may be a portion extending from an end of the 2-1st internal electrode 122a in the Z direction, and a lower end of the 2-1st connection portion 122b may be exposed to the first surface 1 of the capacitor body 110 and may be connected to the second external electrode 132.

The 2-2nd connection portion 124b may be a portion extending from an end of the 2-2nd connection portion 124b in the Z direction, and a portion 124c extending downwardly may be exposed to the first surface 1 of the capacitor body 110 and may be connected to the second external electrode 132.

The 2-1st connection portion 122b and the 2-2nd connection portion 124b may be disposed adjacent to the fourth surface 4 of the capacitor body 110 to increase an effective area of the internal electrode.

In other words, the 2-1st internal electrode 122a may be disposed adjacent to the upper side of the first dielectric layer 111 in the Z direction, and the 2-2nd internal electrode 124a may be formed adjacent to the downward side of the second dielectric layer 112 in the Z direction. Accordingly, when the capacitor body 110 is formed by layering the first and second dielectric layers 111 and 112 in the Z direction, the 2-1st internal electrode 122a and the 2-2nd internal electrode 124a may not overlap each other in the Y direction.

The 2-1st connection portion 122b and the 2-2nd connection portion 124b may be spaced apart from the second, third, and fourth surfaces 2, 3, and 4 of the capacitor body 110.

If desired, the 2-1st connection portion 122b and the 2-2nd connection portion 124b may be configured to be exposed through the fourth surface 4 of the capacitor body 110, but in this case, the second external electrode may need to be formed on the fourth surface 4 of the capacitor body 110, or an insulation portion may need to be disposed on the fourth surface 4 of the capacitor body 110.

Accordingly, a combined structure of the 2-1st internal electrode 122a and the 2-1st connection portion 122b may have an "ㄱ"-shaped form, but an example embodiment thereof is not limited thereto.

The 1-1st internal electrode 121a disposed on the first dielectric layer 111 may be symmetrical to the 2-2nd internal electrode 124a disposed on the second dielectric layer 112 in the X direction, and the 1-2nd internal electrode 123a disposed on the first dielectric layer 111 may be symmetrical to the 2-1st internal electrode 122a disposed on the second dielectric layer 112 in the X direction.

Figure 7A:
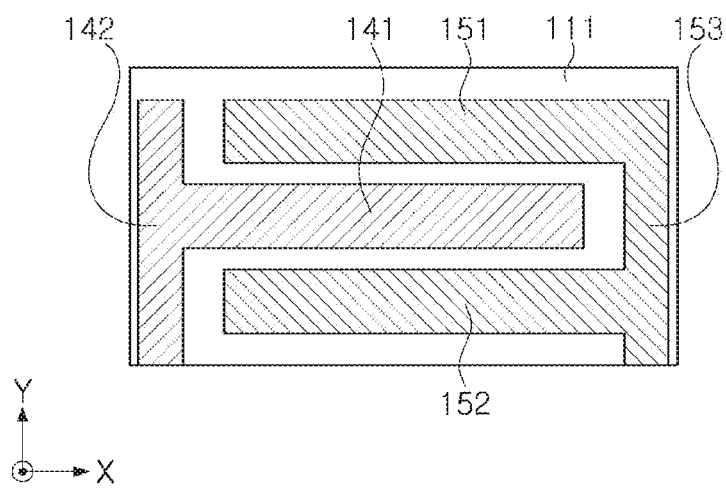
FIGS. 7A and 7B are plan diagrams illustrating another example embodiment of first and second internal electrodes of a multilayer capacitor.
Figure 7B:
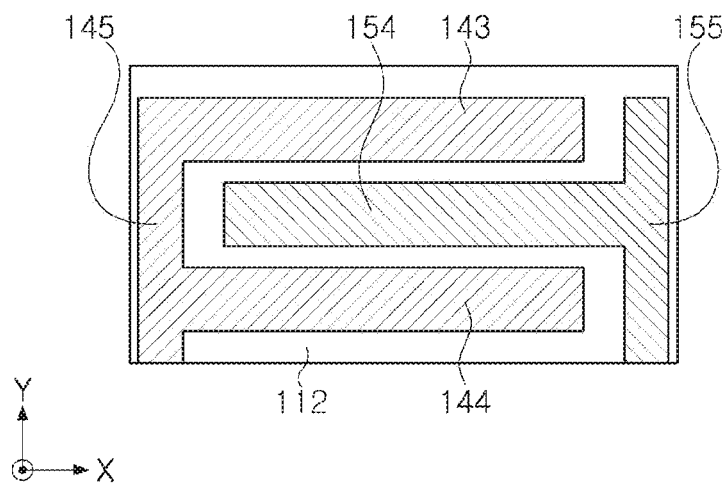

FIGS. 7A and 7B are plan diagrams illustrating another example embodiment of first and second internal electrodes of a multilayer capacitor.

Referring to FIGS. 7A and 7B, the first and second internal electrodes may be spaced apart from the second, third, and fourth surfaces 2, 3, and 4 of the capacitor body 110 in the capacitor body 110.

The first internal electrode may include a 1-1st internal electrode 141 disposed on a first dielectric layer 111 and two 1-2nd internal electrodes 142 and 143 disposed on a second dielectric layer 112 and configured to not overlap the 1-1st internal electrode 141 in the Y direction.

A 1-1st connection portion 142 may be connected to an end of the 1-1st internal electrode 141, and a lower end of the 1-1st connection portion 142 may be exposed through the first surface 1 of the capacitor body 110 and may be connected to a first external electrode 131.

A 1-2nd connection portion 145 may be connected to ends of the two 1-2nd internal electrodes 142 and 143, and a lower end of the 1-2nd connection portion 145 may be exposed through the first surface 1 of the capacitor body 110 and may be connected to the first external electrode 131.

The second internal electrode may include two 2-1st internal electrodes 151 and 152 disposed on the first dielectric layer 111 and configured to overlap the two 1-2nd internal electrodes 143 and 144 in the Y direction, respectively, and a 2-2nd internal electrode 154 disposed on the second dielectric layer 112 and configured to overlap the 1-1st internal electrode 141 in the Y direction.

Also, a 2-1st connection portion 153 may be connected to ends of the two 2-1st internal electrodes 151 and 152, and a lower end of the 2-1st connection portion 153 may be exposed through the first surface 1 of the capacitor body 110 and may be connected to a second external electrode 132.

A 2-2nd connection portion 155 may be connected to an end of the 2-2nd internal electrode 154, and a lower end of the 2-2nd connection portion 155 may be exposed through the first surface 1 of the capacitor body 110 and may be connected to a second electrode 132.

In another example embodiment, the first internal electrode may include a plurality of 1-1st internal electrodes disposed on the first dielectric layer in the second direction in which the first surface and the second surface are connected to each other and spaced apart from each other in the second direction; a plurality of 1-2nd internal electrodes disposed on the second dielectric layer and configured to not overlap the plurality of 1-1st internal electrodes in the first direction and to be spaced apart from each other in the second direction; a 1-1st connection portion connected to the plurality of 1-1st internal electrodes and having an end exposed through the first surface of the capacitor body and connected to the first external electrode; and a 1-2nd connection portion connected to the plurality of 1-2nd internal electrodes and having an end exposed through the first surface of the capacitor body and connected to the first external electrode.

The second internal electrode may include a plurality of 2-1st internal electrodes disposed on the first dielectric layer and configured to overlap the plurality of 1-2nd internal electrodes in the first direction, respectively, and spaced apart from each other in the second direction; a plurality of 2-2nd internal electrodes disposed on the second dielectric layer and configured to overlap the plurality of 1-1st internal electrodes in the first direction, respectively, and to be spaced apart from each other in the second direction; a 2-1st connection portion connected to the plurality of 2-1st internal electrodes and having an end exposed through the first surface of the capacitor body and connected to the second external electrode; and a 2-2 connection portion connected to the plurality of 2-2nd internal electrodes and having an end exposed through the first surface of the capacitor body and connected to the second external electrode.

According to the example embodiment, as the number of current passes of the multilayer capacitor may increase further than the aforementioned example embodiment. Accordingly, directions of electrical fields may be offset from each other such that an inductance element may be reduced, and ESL and ESR of the multilayer capacitor may be reduced.

In the description below, an example embodiment will be described in greater detail.

Figure 8A:
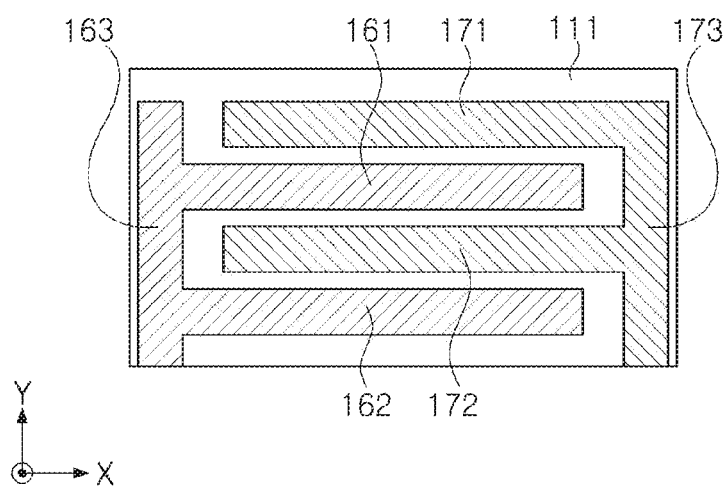
FIGS. 8A and 8B are plan diagrams illustrating another example embodiment of first and second internal electrodes of a multilayer capacitor.
Figure 8B:
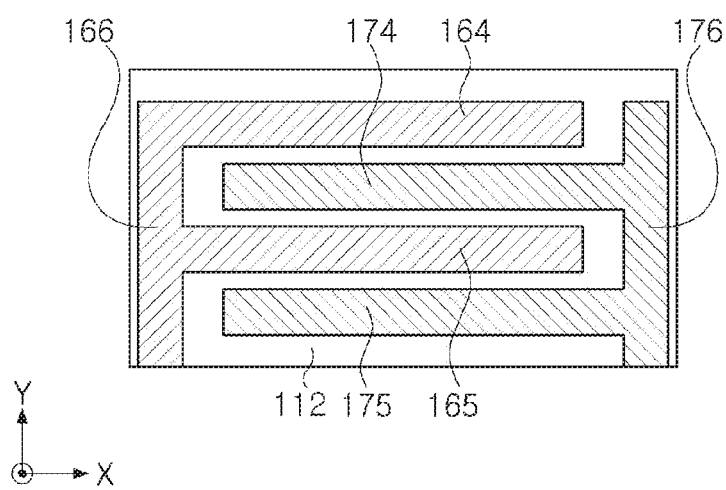

FIGS. 8A and 8B are plan diagrams illustrating another example embodiment of first and second internal electrodes of a multilayer capacitor.

Referring to FIGS. 8A and 8B, first and second internal electrodes may be spaced apart from the second, third, and fourth surfaces 2, 3, and 4 of a capacitor body 110 in the capacitor body 110.

The first internal electrode may include two 1-1st internal electrodes 161 and 162 disposed on a first dielectric layer 111 and spaced apart from each other in the Z direction, and two 1-2nd internal electrodes 164 and 165 disposed on a second dielectric layer 112 and configured to not overlap the two 1-1st internal electrodes 161 and 162 in the Z direction and to be spaced apart from each other in the Y direction.

A 1-1st connection portion 163 may be connected to ends of the two 1-1st internal electrodes 161 and 162 and an end of the 1-1st connection portion 163 may be exposed through the first surface of the capacitor body and connected to a first external electrode 131.

A 1-2nd connection portion 166 may be connected to ends of the two 1-2nd internal electrodes 164 and 165 and an end of the 1-2nd connection portion 166 may be exposed through the first surface of the capacitor body and connected to the first external electrode 131.

The second internal electrode may include two 2-1st internal electrodes 171 and 172 disposed on the first dielectric layer 111 and configured to overlap the two 1-2nd internal electrodes 164 and 165 in the Y direction, respectively, and to be spaced apart from each other in the Z direction, and two 2-2nd internal electrodes 174 and 175 disposed on the second dielectric layer 112 and configured to overlap the two 1-1st internal electrodes 161 and 162 in the Y direction, respectively, and to be spaced apart from each other in the Z direction.

A 2-1st connection portion 173 may be connected to ends of the two 2-1st internal electrodes 171 and 172, and an end of the 2-1st connection portion 173 may be exposed through the first surface of the capacitor body and connected to a second external electrode 132.

A 2-2nd connection portion 176 may be connected to ends of the two 2-2nd internal electrodes 174 and 175, and an end of the 2-1st connection portion 173 may be exposed through the first surface of the capacitor body and connected to the second external electrode 132.

Figure 9A:
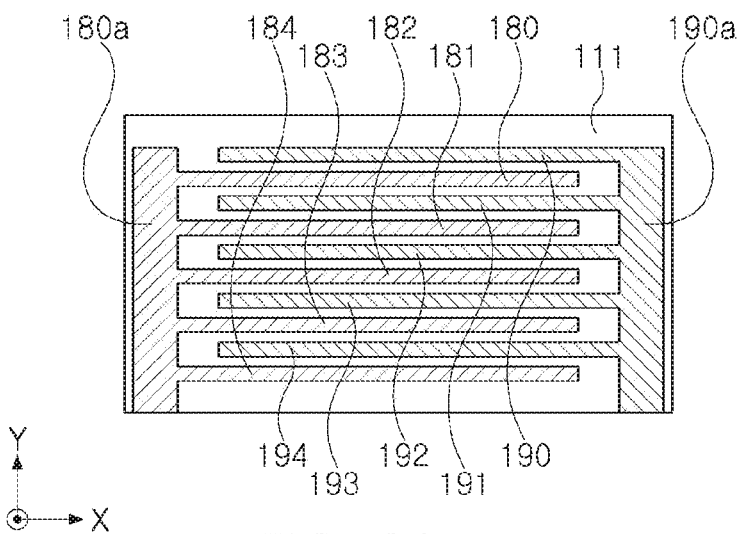
FIGS. 9A and 9B are plan diagrams illustrating another example embodiment of first and second internal electrodes of a multilayer capacitor.
Figure 9B:
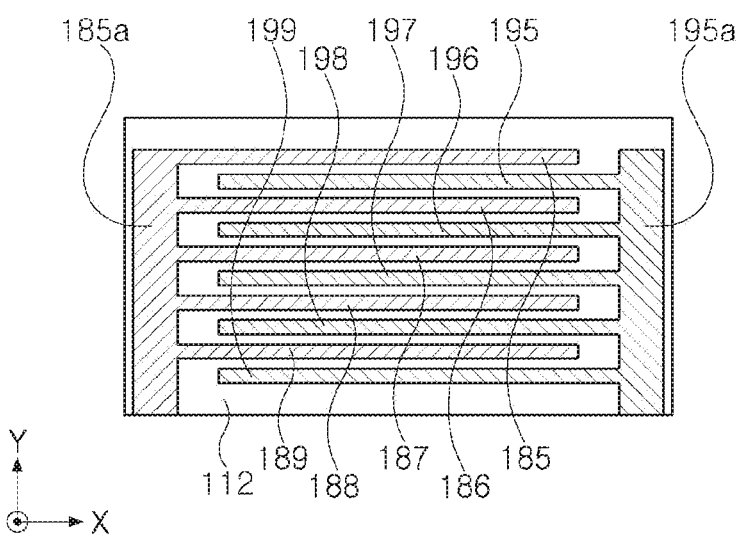

FIGS. 9A and 9B are plan diagrams illustrating another example embodiment of first and second internal electrodes of a multilayer capacitor.

Referring to FIGS. 9A and 9B, a first internal electrode may include five 1-1st internal electrodes 180 to 184 disposed on a first dielectric layer 111 and spaced apart from each other in the Z direction, and five 1-2nd internal electrodes 185 to 189 disposed on a second dielectric layer 112 and configured to not overlap the five 1-1st internal electrodes 180 to 184 in the Y direction and to be spaced apart from each other in the Z direction.

A 1-1st connection portion 180*a* may be connected to ends of the five 1-1st internal electrodes 180 to 184, and an end of the 1-1st connection portion 180*a* may be exposed through the first surface of the capacitor body and connected to a first external electrode 131.

A 1-2nd connection portion 185*a* may be connected to ends of the five 1-2nd internal electrodes 185 to 189, and an end of the 1-2nd connection portion 185*a* may be exposed through the first surface of the capacitor body and connected to a first external electrode 131.

The second internal electrode may include five 2-1st internal electrodes 190 to 194 disposed on the first dielectric layer 111, and configured to overlap the five 1-2nd internal electrodes 185 to 189 in the Y direction, respectively, and to be spaced apart from each other in the Z direction, and five 2-2nd internal electrodes 195 to 199 disposed on the second dielectric layer 112 and configured to overlap the five 1-1st internal electrodes 180 to 184 in the Y direction, respectively, and to be spaced apart from each other in the Z direction.

A 2-1st connection portion 190*a* may be connected to ends of the five 2-1st internal electrodes 190 to 194, and an end of the 2-1st connection portion 190*a* may be exposed through the first surface of the capacitor body and connected to a second external electrode 132.

A 2-2nd connection portion 195*a* may be connected to ends of the five 2-2nd internal electrodes 195 to 199, and an end of the 2-2nd connection portion 195*a* may be exposed through the first surface of the capacitor body and connected to the second external electrode 132.

The multilayer capacitor as configured above may increase a volume of a product as a lower surface electrode structure, and the first and second internal electrodes may overlap in the Y direction and also in the Z direction such that an effective area of the internal electrodes which relates to forming capacitance of the multilayer capacitor may increase. Accordingly, capacitance of the multilayer capacitor may increase.

According to the example embodiment, an effective area of the internal electrodes may increase by 68% approximately as compared to a general multilayer capacitor.

Also, in a conductor in which a current flows, an electrical field may be formed in accordance with a path of a current, and accordingly, an inductance element may be inevitably generated in a direction in which a flow of current is prevented. In a general multilayer capacitor, first and second internal electrodes may be disposed upwardly and downwardly such that a single current path may be implemented.

In the example embodiment, the number of current paths of a multilayer capacitor may greatly increase and directions of currents may be disposed in opposite directions. Accordingly, directions of electrical charges may be offset from each other such that an inductance element may be reduced, and accordingly, ESL and ESR of the multilayer capacitor may be reduced.

Accordingly, the multilayer capacitor of the example embodiment may be applied to various applications requiring relatively low ESL, such as an AP, a smartphone, a laptop, a tablet, a vehicle component, and the like.

If desired, differently from the example embodiment illustrated in the diagrams, in the multilayer capacitor of an example embodiment, the first and second external electrodes may be disposed on the first surface of the capacitor body and may be spaced apart from each other in the Y direction, and the first and second internal electrodes may be configured to rotate in a clockwise direction by 90°.

Figure 10:
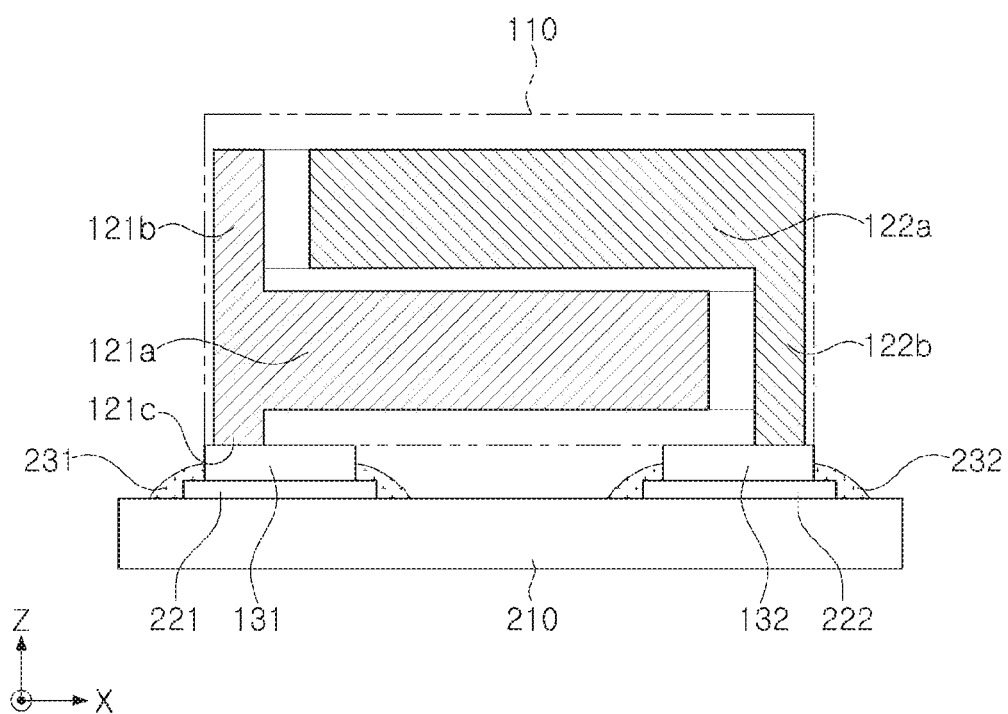
FIG. 10 is a cross-sectional diagram illustrating a state in which a multilayer capacitor is mounted on a board.

Referring to FIG. 10, a board on which a multilayer capacitor is mounted may include a board 210 having first and second electrode pads 221 and 222 disposed on one surface, and a multilayer capacitor 100 mounted on an upper surface of the board 210, where first and second external electrodes 131 and 132 may be mounted on and connected to the first and second electrode pads 221 and 222, respectively.

In the example embodiment, the multilayer capacitor 100 may be configured to be mounted on the board 210 by solders 231 and 232, but an example embodiment thereof is not limited thereto. Instead of solder, conductive paste may be used.

According to the aforementioned example embodiment, by disposing an external electrode on a lower surface of the capacitor body, a volume of a product may increase and an effective area of an internal electrode may be controlled such that the multilayer capacitor may have high capacitance and may have reduced ESR and ESL.

While the exemplary embodiments have been shown and described above, it will be apparent to those skilled in the art that modifications and variations could be made without departing from the scope of the present invention as defined by the appended claims.

What is claimed is:

1. A multilayer capacitor, comprising:
a capacitor body including first and second surfaces opposing each other in a thickness direction of the capacitor body, third and fourth surfaces connected to the first and second surfaces and opposing each other in a length direction of the capacitor body, fifth and sixth surfaces connected to the first and second surfaces and to the third and fourth surfaces and opposing each other in a width direction of the capacitor body, and including first and second dielectric layers, a plurality of first internal electrodes, and a plurality of second internal electrodes alternately layered in the width direction in which the fifth and sixth surfaces oppose each other;
a first external electrode disposed on the first surface of the capacitor body and connected to the plurality of first internal electrodes; and
a second external electrode disposed on the first surface of the capacitor body, spaced apart from the first external electrode, and connected to the plurality of second internal electrodes,
wherein portions of the first and second internal electrodes are disposed on a first dielectric layer and are spaced apart from each other, and other portions of the first and second internal electrodes are disposed on a second dielectric layer and are spaced apart from each other, and
wherein the first and second dielectric layers are alternately layered in the width direction such that the first internal electrode of the first dielectric layer overlaps the second internal electrode of the second dielectric layer in the width direction, and the second internal electrode of the first dielectric layer overlaps the first internal electrode of the second dielectric layer in the width direction,
wherein the first internal electrode includes:
a 1-1st connection portion disposed on the first dielectric layer, having an end extending from the first surface of the capacitor body, and connected to the first external electrode;

a 1-2nd connection portion disposed on the second dielectric layer, having an end extending from the first surface of the capacitor body, and connected to the first external electrode;

a 1-1st internal electrode disposed on the first dielectric layer, and extending from the 1-1st connection portion in the length direction; and a 1-2nd internal electrode disposed on the second dielectric layer, configured to not overlap the 1-1st internal electrode in the width direction, and extending from the 1-2nd connection portion in the length direction, wherein the second internal electrode includes:

a 2-1st connection portion disposed on the first dielectric layer, having an end extending from the first surface of the capacitor body, and connected to the second external electrode;

a 2-2nd connection portion disposed on the second dielectric layer, having an end extending from the first surface of the capacitor body, and connected to the second external electrode;

a 2-1st internal electrode disposed on the first dielectric layer, configured to overlap the 1-2nd internal electrode in the width direction, and extending from the 2-1st connection portion in a direction opposite to the length direction; and a 2-2nd internal electrode disposed on the second dielectric layer, configured to overlap the 1-1st internal electrode in the width direction, and extending from the 2-2nd connection portion in the direction opposite to the length direction, and wherein, in the width direction, each conductive pattern extending from the 1-1st connection portion in the length direction overlaps one conductive pattern extending from the 2-2nd connection portion in the direction opposite to the length direction.

2. The multilayer capacitor of claim 1, wherein the 1-1st internal electrode is symmetrical to the 2-2nd internal electrode in the length direction and the 1-2nd internal electrode is symmetrical to the 2-1st internal electrode in the length direction.

3. The multilayer capacitor of claim 1, wherein the first and second internal electrodes are spaced apart from the second, third, and fourth surfaces of the capacitor body in the capacitor body.

4. The multilayer capacitor of claim 1, wherein each of a combined structure of the 1-2nd internal electrode and the 1-2nd connection portion and a combined structure of the 2-1st internal electrode and the 2-1st connection portion has a "¬"-shaped form.

5. The multilayer capacitor of claim 1,
wherein the first internal electrode further includes:
another 1-2nd internal electrode disposed on the second dielectric layer, configured to not overlap the 1-1st internal electrode in the width direction, and extending from the 1-2nd connection portion in the length direction;
wherein the second internal electrode further includes:
another 2-1st internal electrode disposed on the first dielectric layer, configured to overlap the another 1-2nd internal electrode in the width direction, and extending from the 2-1st connection portion in the direction opposite to the length direction.

6. The multilayer capacitor of claim 5, wherein the first and second internal electrodes are spaced apart from the second, third, and fourth surfaces of the capacitor body in the capacitor body.

7. The multilayer capacitor of claim 5,
wherein the first internal electrode further includes:
another 1-1st internal electrode disposed on the first dielectric layer and extending from the 1-1st connection portion in the length direction;
wherein the second internal electrode further includes:
another 2-2nd internal electrode disposed on the second dielectric layer, configured to overlap the another 1-1st internal electrode in the width direction, and extending from the 2-2nd connection portion in the direction opposite to the length direction.

8. The multilayer capacitor of claim 7, wherein the first and second internal electrodes are spaced apart from the second, third, and fourth surfaces of the capacitor body in the capacitor body.

9. A board on which the multilayer capacitor of claim 1 is mounted, the board comprising:
a board having first and second electrode pads on one surface; and
the multilayer capacitor,
wherein the first and second external electrodes are mounted on and connected to the first and second electrode pads, respectively.

10. The multilayer capacitor of claim 1, wherein each of the first and second external electrodes is disposed only on the first surface.

11. The multilayer capacitor of claim 1, wherein the 1-1st connection portion overlaps the 2-2nd connection portion in the width direction, and
the 2-1st connection portion overlaps the 2-2nd connection portion in the width first direction.

* * * * *